（12）United States Patent
Shih

(10) Patent No.: US 10,153,161 B1
(45) Date of Patent: Dec. 11, 2018

(54) METHOD FOR MANUFACTURING A SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/822,229

(22) Filed: Nov. 27, 2017

(51) Int. Cl.
*H01L 21/00* (2006.01)
*H01L 21/027* (2006.01)
*H01L 21/033* (2006.01)

(52) U.S. Cl.
CPC ...... *H01L 21/0274* (2013.01); *H01L 21/0332* (2013.01)

(58) Field of Classification Search
None
See application file for complete search history.

(56) References Cited

U.S. PATENT DOCUMENTS

| | | | | |
|---|---|---|---|---|
| 2006/0166482 | A1* | 7/2006 | Kanamura | H01L 21/76811 438/623 |
| 2007/0077743 | A1* | 4/2007 | Rao | H01L 21/3086 438/595 |
| 2008/0076260 | A1* | 3/2008 | Muramatsu | G03F 7/423 438/736 |
| 2008/0081412 | A1* | 4/2008 | Jung | H01L 21/0337 438/257 |
| 2010/0167021 | A1* | 7/2010 | Lee | H01L 21/0332 428/195.1 |
| 2011/0235212 | A1* | 9/2011 | Sakurai | B82Y 10/00 360/135 |

\* cited by examiner

*Primary Examiner* — Angel Roman
(74) *Attorney, Agent, or Firm* — CKC & Partners Co., Ltd.

(57) ABSTRACT

A method for manufacturing a semiconductor structure includes forming a target layer, a lower hard mask layer, a middle hard mask layer, and an upper hard mask layer in sequence on a substrate. A first mask layer is then formed on the upper hard mask layer, wherein the first mask layer has a plurality of openings exposing a portion of the upper hard mask layer. A patterned upper hard mask layer having a plurality of apertures exposing a portion of the middle hard mask layer is formed by etching the exposed portion of the upper hard mask layer. A patterned organic layer is then formed on the exposed portion of the middle hard mask layer. A patterned target layer is formed by etching the patterned upper hard mask layer, the patterned organic layer, the middle hard mask layer, the lower hard mask layer, and a portion of the target layer.

13 Claims, 6 Drawing Sheets

METHOD FOR MANUFACTURING A SEMICONDUCTOR STRUCTURE

BACKGROUND

Field of Invention

The present invention relates to a method for manufacturing a semiconductor structure. More particularly, the present invention relates to a method for manufacturing fine patterns of semiconductor structure by using double patterning technology.

Description of Related Art

As semiconductor devices become smaller and highly integrated, a number of technologies for fabricating fine patterns for semiconductor devices have been developed. Particularly, the required pitch size and critical dimension (CD) are continuously shrinkage. However, photolithographic processes for fabricating semiconductor features have appeared a limitation in the resolution of the exposure apparatus.

In order to make semiconductor devices fine beyond the resolution limit of photolithographic processes, double patterning technologies such as lithography-etching-lithography-etching (LELE) processes or the like has been actively developed. However, the conventional LELE processes have the problem that features are easily damaged, and that leads to a low yield. Accordingly, there is a demand for a method for solving the above problems.

SUMMARY

The present invention has been made in an effort to improve the conventional double patterning technology, providing a method for manufacturing a semiconductor structure with fine patterns.

In accordance with an aspect of the present invention, a method for manufacturing a semiconductor structure is provided. The method includes forming a target layer, a lower hard mask layer, a middle hard mask layer, and an upper hard mask layer in sequence on a substrate, forming a first mask layer on the upper hard mask layer, wherein the first mask layer has a plurality of openings exposing a portion of the upper hard mask layer, etching the exposed portion of the upper hard mask layer to form a patterned upper hard mask layer having a plurality of apertures exposing a portion of the middle hard mask layer, forming a patterned organic layer on the exposed portion of the middle hard mask layer, and etching the patterned upper hard mask layer, the patterned organic layer, the middle hard mask layer, the lower hard mask layer, and a portion of the target layer to form a patterned target layer having a plurality of recess thereon.

According to one embodiment of the present invention, the patterned upper hard mask layer has a plurality of first stripe structures, the patterned organic layer has a plurality of second stripe structures, the second stripe structures and the first stripe structures are parallel and each of the second stripe structures is disposed between the first stripe structures.

According to another embodiment of the present invention, the upper hard mask layer and the middle hard mask layer are made of different material.

According to another embodiment of the present invention, the upper hard mask layer includes silicon oxide.

According to another embodiment of the present invention, the middle hard mask layer includes silicon nitride, silicon oxynitride or silicon carbide According to another embodiment of the present invention, the middle hard mask layer and the lower hard mask layer are made of different material.

According to another embodiment of the present invention, the lower hard mask layer comprises amorphous carbon, or polysilicon oxide.

According to another embodiment of the present invention, etching the exposed portion of the upper hard mask layer includes using an anisotropic etching process.

According to another embodiment of the present invention, etching the patterned upper hard mask layer, the patterned organic layer, the middle hard mask layer, the lower hard mask layer, and a portion of the target layer includes using an anisotropic etching process.

According to another embodiment of the present invention, forming the patterned organic layer on the exposed portion of the middle hard mask layer includes forming an organic layer covering the patterned upper hard mask layer and the exposed portion of the middle hard mask layer, forming a second mask layer on the organic layer, and etching the organic layer to form the patterned organic layer.

According to another embodiment of the present invention, the patterned organic layer has a plurality of gaps exposing the patterned upper hard mask layer and a portion of the middle hard mask layer.

According to another embodiment of the present invention, the patterned organic layer has a thickness that is greater than a thickness of the patterned upper hard mask layer.

According to another embodiment of the present invention, the upper hard mask layer has a thickness that is greater than a thickness of the middle hard mask layer.

It is to be understood that both the foregoing general description and the following detailed description are by examples, and are intended to provide further explanation of the invention as claimed.

BRIEF DESCRIPTION OF THE DRAWINGS

Aspects of the instant disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
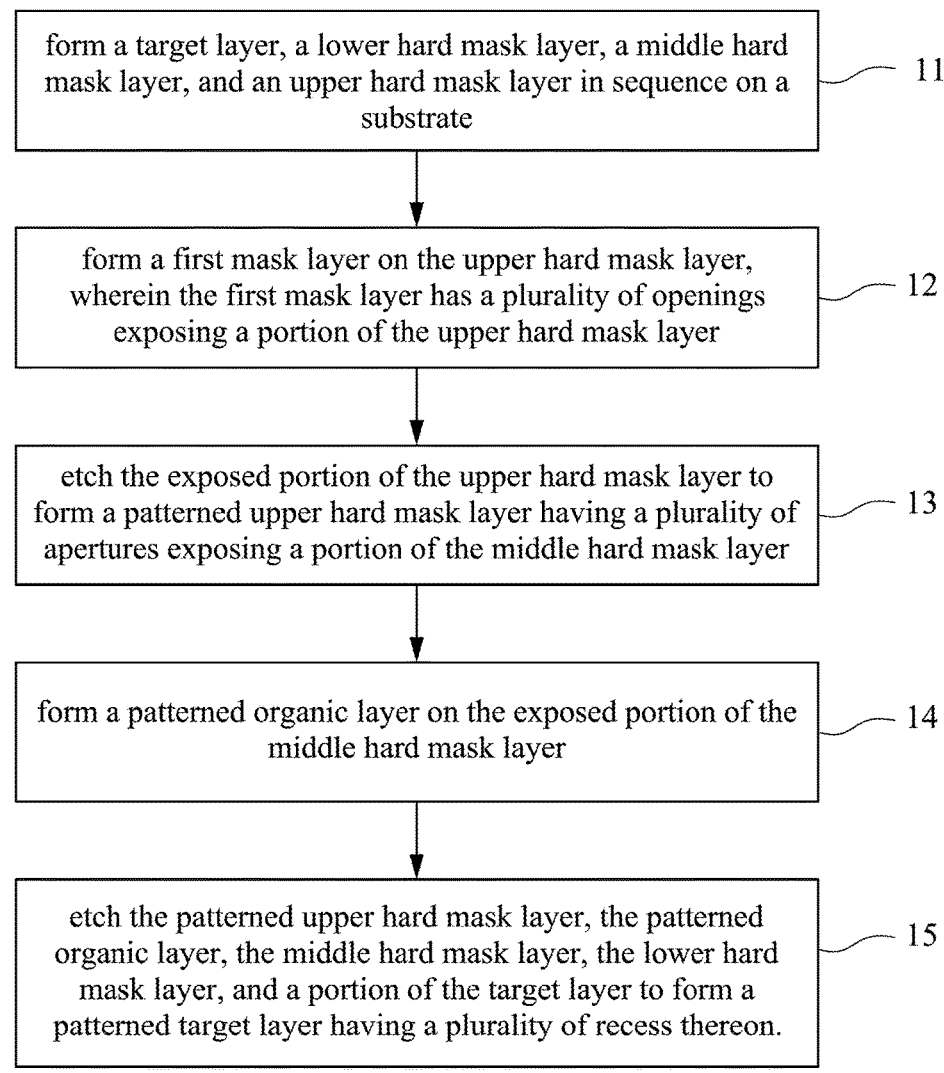
FIG. 1 is a flow chart illustrating a method of manufacturing a semiconductor structure in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

FIG. 1 is a flow chart of a method 10 for manufacturing a semiconductor structure in accordance with some exemplary embodiments of the instant disclosure. The method 10 begins with operation 11 in which a target layer, a lower hard mask layer, a middle hard mask layer, and an upper hard mask layer are formed in sequence on a substrate. The method continues with operation 12 in which a first mask layer is formed on the upper hard mask layer, and the first mask layer has a plurality of openings exposing a portion of the upper hard mask layer. The method continues with operation 13 in which the exposed portion of the upper hard mask layer is etched to form a patterned upper hard mask layer having a plurality of apertures exposing a portion of the middle hard mask layer. The method continues with operation 14 in which a patterned organic layer is formed on the exposed portion of the middle hard mask layer. The method continues with operation 15 in which the patterned upper hard mask layer, the patterned organic layer, the middle hard mask layer, the lower hard mask layer, and a portion of the target layer are etched to form a patterned target layer having a plurality of recess thereon. The discussion that follows illustrates embodiments of semiconductor structure that can be manufactured according to the method 10 of FIG. 1. While method 10 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 2A through FIG. 4 are cross-sectional views illustrating various intermediary stages in manufacturing of a semiconductor structure in accordance with various embodiments.

Figure 2A:
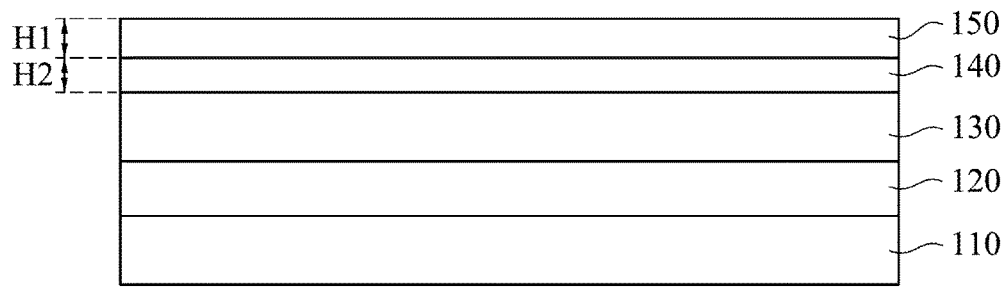
FIGS. 2A through 4 are cross-sectional views of various intermediary stages in the manufacturing of semiconductor structure in accordance with some embodiments of the instant disclosure.

Reference is made to FIG. 2A. A target layer 120, a lower hard mask layer 130, a middle hard mask layer 140, and an upper hard mask layer 150 are formed in sequence on a substrate 110 (operation 11 of FIG. 1). Formation of the target layer 120, the lower hard mask layer 130, the middle hard mask layer 140, and the upper hard mask layer 150 may include any suitable deposition method, such as plasma-enhanced atomic layer deposition (PEALD), chemical vapor deposition (CVD), plasma-enhanced chemical vapor deposition (PECVD), physical vapor deposition (PVD), and the like. The upper hard mask layer 150 and the middle hard mask layer 140 are made of different materials, that is, the upper hard mask layer 150 may have an etch selectivity different from the middle hard mask layer 140. In some embodiments, the upper hard mask layer 150 is made of inorganic material. In some embodiments, the upper hard mask layer 150 and the middle hard mask layer 140 may include silicon oxide, silicon nitride (SiN), silicon oxynitride (SiON), silicon carbide, or the like. For example, the upper hard mask layer 150 may be made of oxide-rich silicon oxide, and the middle hard mask layer 140 may be made of silicon-rich silicon nitride (SiN). In some examples, the oxide atom % of the upper hard mask layer 150 is greater than that of the middle hard mask layer 140. Alternatively, the silicon atom % of the upper hard mask layer 150 is less than that of the middle hard mask layer 140. Further, the middle hard mask layer 140 and the lower hard mask layer 130 may also include different materials, and the middle hard mask layer 140 may also have an etch selectivity different from the lower hard mask layer 130. In some embodiments, the lower hard mask layer 130 may include amorphous carbon, or polysilicon oxide. In some embodiments, the upper hard mask layer 150 may have a thickness H1, and the middle hard mask layer 140 may have a thickness H2. In some embodiments, the thickness H1 is greater than the thickness H2.

In some embodiments, the target layer 120 may include tetraethoxysilane (TEOS), spin-on-glass (SOG), SiON, a composite of low temperature oxide (LTO) and Si-contained BARC, or the like. In some embodiments, the target layer 120 may be a semiconductor substrate, such as a bulk semiconductor, a semiconductor-on-insulator (SOI) substrate, or the like, which may be doped (e.g., with a p-type or an n-type dopant) or undoped. In other embodiments, the target layer 120 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2B:
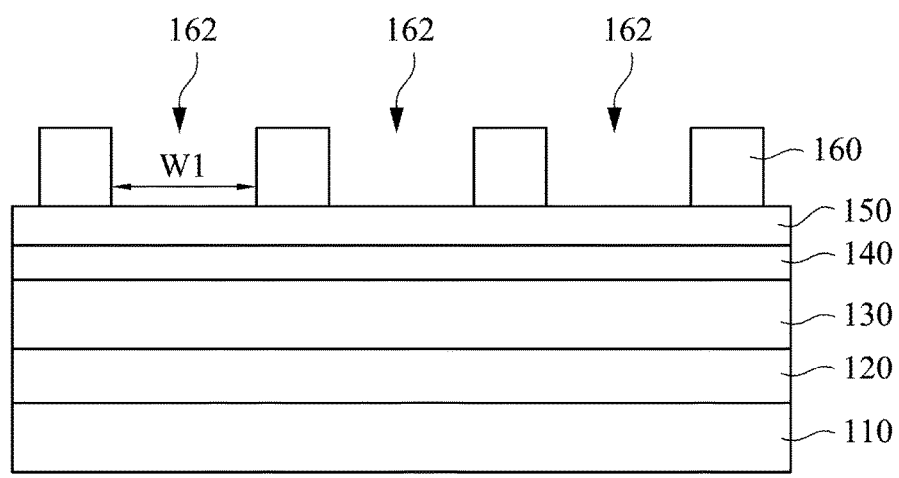

Reference is made to FIG. 2B. A first mask layer 160 is formed on the upper hard mask layer 150, and the first mask layer 160 has a plurality of openings 162 exposing a portion of the upper hard mask layer 150 (operation 12 of FIG. 1). Formation of the first mask layer 160 may include, for example, spin-on coating a photoresist material on the upper hard mask layer 150. Subsequently, the photoresist material is patterned to form the first mask layer 160 by photolithographic process. As shown in FIG. 2B the first mask layer 160 has a plurality of openings 162, exposing a portion of the upper hard mask layer 150. In some embodiments, each of the plurality of openings 162 has a width W1. In some embodiments, the first mask layer 160 may include a variety of patterns, for example, a stripe pattern, an island pattern, or an array of pillars. In some embodiments, the first mask layer 160 may have a plurality of stripe structures that are adjacent to each other.

Figure 2C:
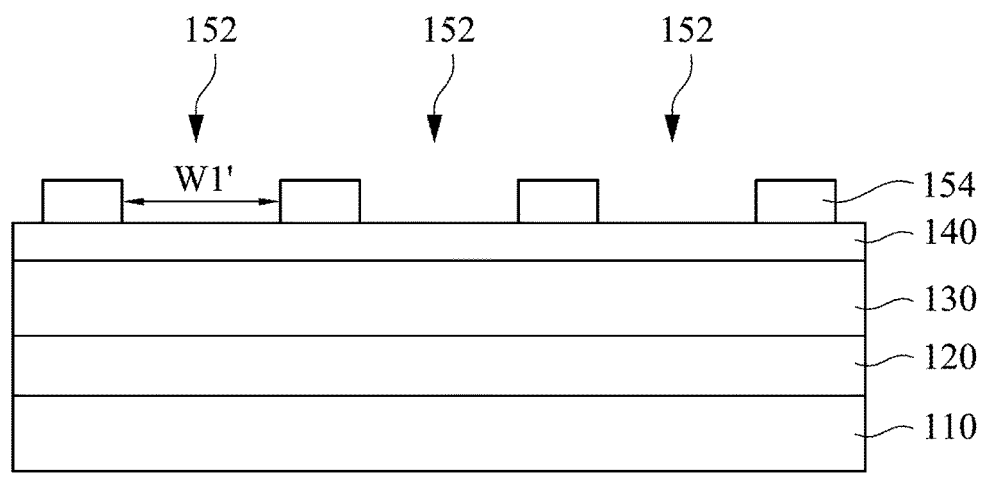

Reference is made to FIG. 2C. The exposed portion of the upper hard mask layer 150 is etched to form a patterned upper hard mask layer 154 having a plurality of apertures 152 exposing a portion of the middle hard mask layer 140 (operation 13 of FIG. 1). The patterned upper hard mask layer 154 is formed by performing an etching process, which may include using the first mask layer 160 as an etch barrier and etching the upper hard mask layer 150 that is exposed by the openings 162 shown in FIG. 2B until the underlying middle hard mask layer 140 is exposed. In some embodiments, the etching process may include any suitable wet etching process or dry etching process such as a reactive ion etching (RIE) process. As shown in FIG. 2C, the patterned upper hard mask layer 154 has a plurality of apertures 152 exposing a portion of the middle hard mask layer 140. The openings 162 (shown in FIG. 2B) overlap the apertures 152 (shown in FIG. 2C) in a direction perpendicular to a principle surface of the middle hard mask layer 140. In some embodiments, each of the plurality of the apertures 152 has a width W1', which is substantially equal to the width W1 of the openings 162. In some embodiments, the patterned upper hard mask layer 154 may have a variety of patterns, for example, a stripe pattern, an island pattern, or an array of pillars. In some embodiments, the patterned upper hard mask layer 154 has a plurality of first stripe structures that are adjacent to each other.

Figure 3A:
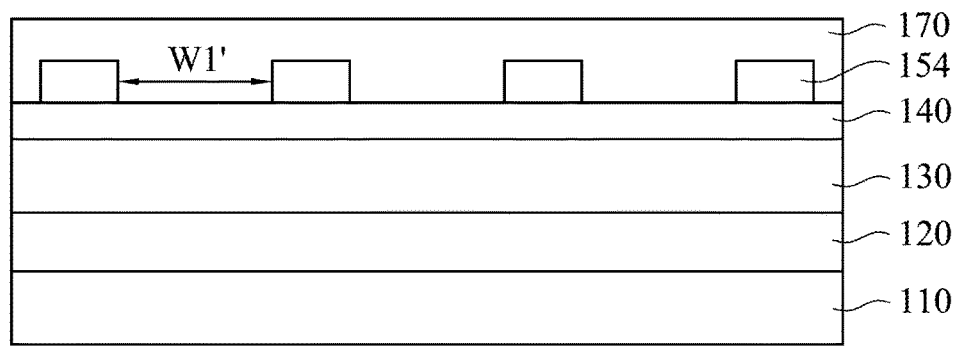
Figure 3B:
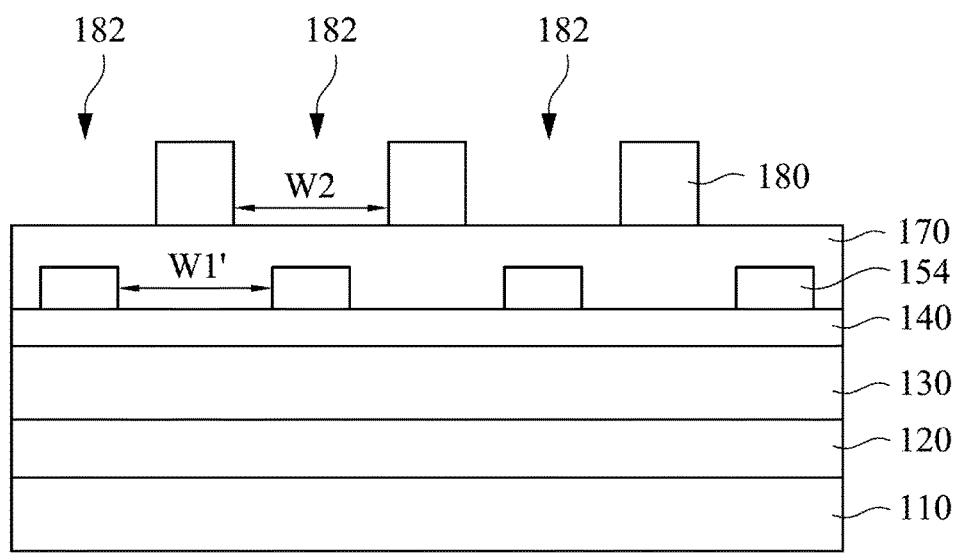
Figure 3C:
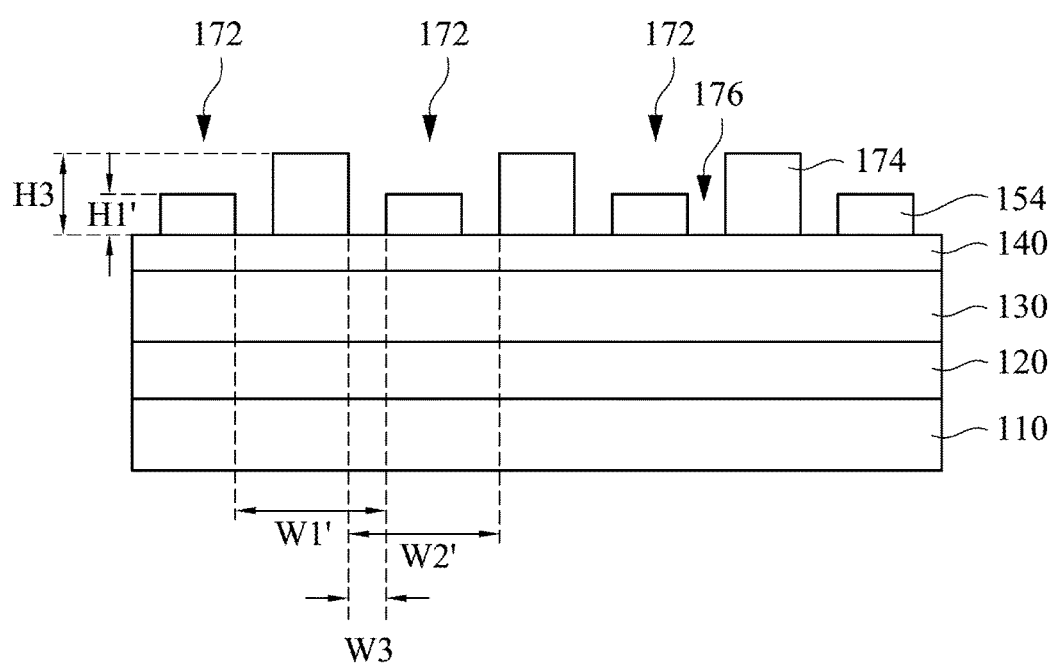

Reference is made to FIGS. 3A to 3C. A patterned organic layer 174 is formed on the exposed portion of the middle hard mask layer 140 (operation 14 of FIG. 1). Referring now to FIG. 3A, an organic layer 170 is formed over the substrate 110 and covers the patterned upper hard mask layer 154 and the exposed portion of the middle hard mask layer 140. The organic layer 170 may be formed by suitable coating methods such as spin-on coating, die coating and the like, or other deposition processes such as chemical vapor deposition (CVD), plasma-enhanced chemical vapor deposition (PECVD) and the like. The organic layer 170 may fill the apertures 152 and has a thickness greater than the height of the patterned upper hard mask layer 154 so that the organic layer 170 has a planar upper surface over the substrate 110. In some embodiments, the organic layer 170 may include any suitable organic materials such as, resist underlayer polymer. In some embodiments, a bottom anti-reflective coating (BARC) may further be formed on the organic layer 170.

Referring now to FIG. 3B, a second mask layer 180 is formed on the organic layer 170. Formation of the second mask layer 180 may be the same as or similar to that of the first mask layer 160, which may include, for example, spin-on coating a photoresist material on the upper surface of the organic layer 170. Subsequently, a photolithographic process is performed to pattern the photoresist material and to form the second mask layer 180. As shown in FIG. 3B, the second mask layer 180 has a plurality of openings 182 exposing a portion of the organic layer 170. The second mask layer 180 is not overlapped with the patterned upper hard mask layer 154 in the direction perpendicular to the planar upper surface of the organic layer 170. In some embodiments, each of the plurality of openings 182 has a width W2. In some embodiments, the width W2 may be greater than the width W1 and W1'. In yet some embodiments, the width W2 may be smaller than the width W1 and W1'. In some embodiments, the width W2 may be substantially equal to the width W1 and W1'. In some embodiments, the second mask layer 180 may include a variety of patterns, for example, a stripe pattern, an island pattern, or an array of pillars. In some embodiments, the second mask layer 180 may have a plurality of stripe structures that is adjacent to each other.

Referring now to FIG. 3C, a portion of the organic layer 170 is removed to form the patterned organic layer 174 positioned in the apertures 152 (indicated in FIG. 2C). For example, the patterned organic layer 174 may be formed by performing an etching process. More specifically, the etching process may include using the second mask layer 180 as an etch barrier, and etching a portion of the organic layer 170 exposed by the openings 182. The etching process may stop while the patterned upper hard mask layer 154 and the middle hard mask layer 140 are exposed. As shown in FIG. 3C, the patterned organic layer 174 has a plurality of gaps 172 exposing the patterned upper hard mask layer 154 and a portion of the middle hard mask layer 140. A plurality of trenches 176 are formed between the patterned upper hard mask layer 154 and the patterned organic layer 174. In some embodiments, the patterned organic layer 174 and the patterned upper hard mask layer 154 are misaligned and separated by the trenches 176. In some embodiments, each of the plurality of gaps 172 has a width W2', which is substantially equal to the width W2. In some embodiments, each of the plurality of trenches 176 has a width W3. In some embodiments, the width W3 is smaller than the width W1, W1', W2, and W2'. In some embodiments, the patterned organic layer 174 may have a variety of patterns, for example, a stripe pattern, an island pattern, or an array of pillars. In some embodiments, the patterned organic layer 174 may have a plurality of second stripe structures. In some embodiments, the plurality of second stripe structures of the patterned organic layer 174 are parallel with the plurality of first stripe structures of the patterned upper hard mask layer 154. In some embodiments, each of the second stripe structures is disposed between adjacent ones of the first stripe structures. In some embodiments, the patterned upper hard mask layer 154 has a thickness H1' and the patterned organic layer 174 has a thickness H3. In some embodiments, the thickness H3 may be greater than or equal to the thickness H1'.

Figure 4:
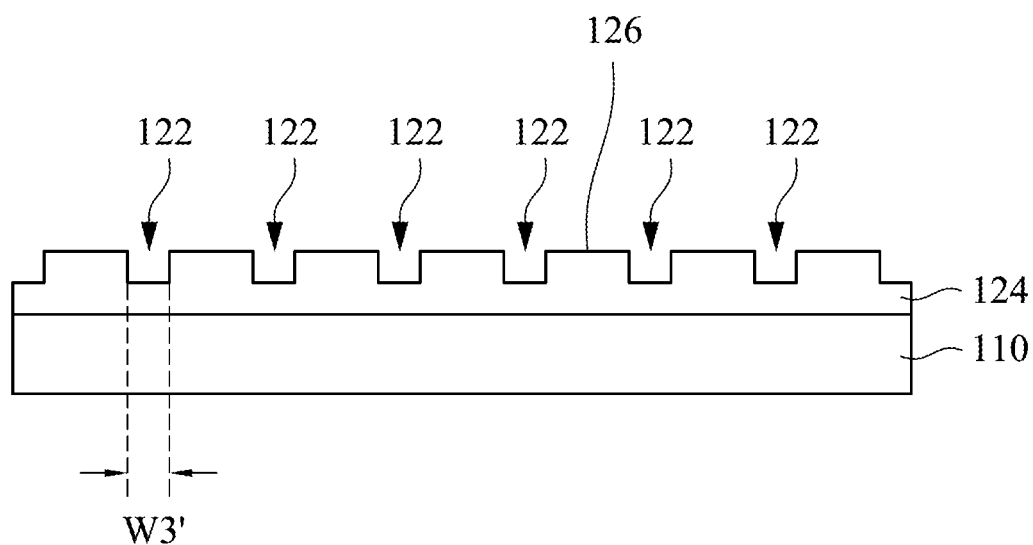

Reference is made to FIG. 4. The patterned upper hard mask layer 154, the patterned organic layer 174, the middle hard mask layer 140, the lower hard mask layer 130, and a portion of the target layer 120 are etched to form a patterned target layer 124 having a plurality of recesses 122 thereon (operation 15 of FIG. 1). The patterned target layer 124 is formed by performing an etching process. In some embodiments, the etching process may include a dry etching process such as a reactive ion etching (RIE) process. More specifically, the etching process includes etching the entire patterned upper hard mask layer 154, the entire patterned organic layer 174, the entire middle hard mask layer 140, the entire lower hard mask layer 130, and a portion of the target layer 120 which underlies the trenches 176. The etched portion of the target layer 120 constitutes the recesses 122 on the target layer 120. As shown in FIG. 4 and FIG. 3C, the recesses 122 are aligned with the trenches 176. In some embodiments, each of the recesses 122 have a width W3', which is substantially equal to the width W3 of the trenches 176, and the width W3' may also be smaller than the width W1, W1', W2, and W2'. In some embodiments, the patterned target layer 124 may include a plurality of highland portions 126, and two adjacent highland portions 126 are separated by one of the recesses 122. In examples, each recess 122 and/or highland portion may have a variety of patterns, for example, a stripe pattern, an island pattern, or an array of pillars. In some embodiments, the highland portions 126 of the patterned target layer 124 have a contour (in a plan view) that is the same as or similar to the collection of the pattern of the patterned upper hard mask layer 154 and the pattern of the patterned organic layer 174. In some embodiments, the thickness H3 of the patterned organic layer 174 is 100%-300% of the thickness H1' of the patterned upper hard mask layer 154, such as 120%, 150%, 200%, and 250%. According to some embodiments, the difference between thickness H3 of the patterned organic layer 174 and the thickness H1' of the patterned upper hard mask layer 154 facilitate to obtain the highland portions 126 that are of equal height measured from the bottom of one of the recess 122.

The method for manufacturing a semiconductor structure disclosed herein is a novel method, which includes forming an upper hard mask layer, a middle hard mask layer, and a lower hard mask layer on the target layer. Herein, the upper hard mask layer and the middle hard mask layer may include different material, so that the upper hard mask layer may have an etch selectivity different from that of the middle hard mask layer. Further, the lower hard mask layer may be made of a material different from that of the middle hard mask layer. In some embodiments, the etch selectivity of the upper hard mask layer is greater than that of the middle hard mask layer, which is greater than that of the lower hard mask layer. In yet some embodiments, the etch selectivity of the middle hard mask layer is greater than that of the upper hard mask layer, which is greater than that of the low hard mask layer. Alternatively, the etch selectivity of the low hard mask layer is greater than that of the upper hard mask layer, which is greater than that of the middle hard mask layer. The embodiments of the present disclosure discussed above have advantages over conventional methods, and the advantages are summarized below. The method of the present disclosure prevents the damage of the patterned layer during the pattern transferring processes, and also reduces the pitch of patterns. The patterned target layer formed by the method of the present disclosure has a relatively smaller critical dimension.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor structure, comprising:
    forming a target layer, a lower hard mask layer, a middle hard mask layer, and an upper hard mask layer in sequence on a substrate;
    forming a first mask layer on the upper hard mask layer, wherein the first mask layer has a plurality of openings exposing a portion of the upper hard mask layer;
    etching the exposed portion of the upper hard mask layer to form a patterned upper hard mask layer having a plurality of apertures exposing a portion of the middle hard mask layer;
    forming a patterned organic layer on the exposed portion of the middle hard mask layer; and
    etching the patterned upper hard mask layer, the patterned organic layer, the middle hard mask layer, the lower hard mask layer, and a portion of the target layer to form a patterned target layer, wherein the etching of the patterned target layer forms a plurality of recesses thereon and forms a plurality of bottom portions of the patterned target layer, and each bottom portion is under a corresponding one of the recesses.

2. The method of claim 1, wherein the patterned upper hard mask layer has a plurality of first stripe structures, the patterned organic layer has a plurality of second stripe structures, the second stripe structures and the first stripe structures are parallel and each of the second stripe structures is disposed between the first stripe structures.

3. The method of claim 1, wherein the upper hard mask layer and the middle hard mask layer are made of different material.

4. The method of claim 3, wherein the upper hard mask layer includes silicon oxide, silicon nitride, silicon oxynitride or silicon carbide.

5. The method of claim 3, wherein the middle hard mask layer includes silicon oxide, silicon nitride, silicon oxynitride or silicon carbide.

6. The method of claim 1, wherein the middle hard mask layer and the lower hard mask layer are made of different material.

7. The method of claim 6, wherein the lower hard mask layer comprise amorphous carbon, or polysilicon oxide.

8. The method of claim 1, wherein etching the exposed portion of the upper hard mask layer includes using an anisotropic etching process.

9. The method of claim 1, wherein etching the patterned upper hard mask layer, the patterned organic layer, the middle hard mask layer, the lower hard mask layer, and a portion of the target layer includes using an anisotropic etching process.

10. The method of claim 1, wherein forming the patterned organic layer on the exposed portion of the middle hard mask layer includes:
    forming an organic layer covering the patterned upper hard mask layer and the exposed portion of the middle hard mask layer;
    forming a second mask layer on the organic layer; and
    etching the organic layer to form the patterned organic layer.

11. The method of claim 1, wherein the patterned organic layer has a plurality of gaps exposing the patterned upper hard mask layer and a portion of the middle hard mask layer.

12. The method of claim 1, wherein the patterned organic layer has a thickness that is greater than a thickness of the patterned upper hard mask layer.

13. The method of claim 1, wherein the upper hard mask layer has a thickness that is greater than a thickness of the middle hard mask layer.

* * * * *